(12) United States Patent
Park et al.

(10) Patent No.: US 11,289,375 B2
(45) Date of Patent: Mar. 29, 2022

(54) FULLY ALIGNED INTERCONNECTS WITH SELECTIVE AREA DEPOSITION

(71) Applicant: International Business Machines Corporation, Armonk, NY (US)

(72) Inventors: Chanro Park, Clifton Park, NY (US); Kenneth Chun Kuen Cheng, Albany, NY (US); Koichi Motoyama, Clifton Park, NY (US); Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 103 days.

(21) Appl. No.: 16/826,566

(22) Filed: Mar. 23, 2020

(65) Prior Publication Data

US 2021/0296172 A1    Sep. 23, 2021

(51) Int. Cl.
| | |
|---|---|
| *H01L 21/768* | (2006.01) |
| *H01L 23/522* | (2006.01) |
| *H01L 21/02* | (2006.01) |
| *H01L 21/311* | (2006.01) |
| *H01L 23/532* | (2006.01) |

(52) U.S. Cl.
CPC .... *H01L 21/76897* (2013.01); *H01L 21/7685* (2013.01); *H01L 21/76807* (2013.01); *H01L 21/76829* (2013.01); *H01L 23/5226* (2013.01); *H01L 21/02068* (2013.01); *H01L 21/31111* (2013.01); *H01L 23/53228* (2013.01)

(58) Field of Classification Search
CPC ................................................ H01L 21/76897
See application file for complete search history.

(56) References Cited

U.S. PATENT DOCUMENTS

| | | | |
|---|---|---|---|
| 5,614,765 A | 3/1997 | Avanzino et al. | |
| 5,795,823 A | 8/1998 | Avanzino et al. | |
| (Continued) | | | |

FOREIGN PATENT DOCUMENTS

| | | |
|---|---|---|
| WO | 2009142982 A2 | 11/2009 |
| WO | 2009142982 A3 | 11/2009 |

OTHER PUBLICATIONS

Cheng, Yi-Lung, et al. "Porous Low-Dielectric-Constant Material for Semiconductor Microelectronics," IntechOpen: Nanofluid Flow in Porous Media, DOI: http://dx.doi.org/10.5772/intechopen.81577; (2019), 25 pages.

*Primary Examiner* — Daniel Luke
(74) *Attorney, Agent, or Firm* — Cantor Colburn LLP; L. Jeffrey Kelly

(57) ABSTRACT

Interconnect structures and methods for forming the interconnect structures generally include forming a dielectric layer over a substrate. The dielectric layer includes a dielectric layer top surface. A metal line is formed in the dielectric layer. The metal line includes a sacrificial upper region and a lower region. The sacrificial upper region is formed separately from the lower region and the lower region includes a lower region top surface positioned below the dielectric layer top surface. The sacrificial upper region is removed, thereby exposing the lower region top surface and forming a trench defined by the lower region top surface and sidewalls of the dielectric layer. An interconnect structure is deposited such that at least a portion of the interconnect structure fills the trench, thereby defining a fully aligned top via.

13 Claims, 2 Drawing Sheets

(56) References Cited

U.S. PATENT DOCUMENTS

| | | |
|---|---|---|
| 5,882,996 A | 3/1999 | Dai |
| 5,935,762 A | 8/1999 | Dai et al. |
| 5,942,446 A | 8/1999 | Chen et al. |
| 5,985,762 A | 11/1999 | Geffken |
| 6,147,009 A | 11/2000 | Grill |
| 6,225,211 B1 | 5/2001 | Tsui |
| 6,281,585 B1 | 8/2001 | Bothra |
| 6,297,117 B1 | 10/2001 | Yu |
| 6,436,810 B1 | 8/2002 | Kumar |
| 6,445,050 B1 | 9/2002 | Chediak |
| 6,455,409 B1 | 9/2002 | Subramanian |
| 6,492,276 B1 | 12/2002 | Huang |
| 6,514,672 B2 | 2/2003 | Young |
| 6,521,542 B1 | 2/2003 | Armacost |
| 6,524,950 B1 | 2/2003 | Lin |
| 6,576,545 B1 | 6/2003 | Hopper et al. |
| 6,645,864 B1 | 11/2003 | Lin et al. |
| 6,713,386 B1 | 3/2004 | Hu et al. |
| 6,743,732 B1 | 6/2004 | Lin et al. |
| 6,809,028 B2 | 10/2004 | Chen |
| 6,812,040 B2 | 11/2004 | Kyler et al. |
| 6,946,376 B2 | 9/2005 | Chediak et al. |
| 7,030,031 B2 | 4/2006 | Willie |
| 7,413,990 B2 | 8/2008 | Ye et al. |
| 7,514,361 B2 | 4/2009 | Bonilla et al. |
| 7,611,986 B2 | 11/2009 | Olmen et al. |
| 7,745,282 B2 | 6/2010 | Yang et al. |
| 7,767,533 B2 | 8/2010 | Kim |
| 7,858,513 B2 | 12/2010 | Mohapatra et al. |
| 7,998,864 B2 | 8/2011 | Yang et al. |
| 8,039,966 B2 | 10/2011 | Yang et al. |
| 8,138,604 B2 | 3/2012 | Yang et al. |
| 8,299,625 B2 | 10/2012 | Ponoth et al. |
| 9,006,106 B2 | 4/2015 | Kao et al. |
| 9,059,257 B2 | 6/2015 | Li et al. |
| 9,324,650 B2 | 4/2016 | Edelstein et al. |
| 9,520,321 B2 * | 12/2016 | Ryan .................. H01L 23/5226 |
| 9,793,156 B1 | 10/2017 | Yang |
| 2001/0046632 A1 | 11/2001 | Young |
| 2002/0081855 A1 | 6/2002 | Jiang et al. |
| 2003/0044725 A1 | 3/2003 | Hsue et al. |
| 2003/0129842 A1 | 7/2003 | Wang et al. |
| 2003/0232504 A1 | 9/2003 | Eppler et al. |
| 2004/0087164 A1 | 5/2004 | Bao et al. |
| 2004/0127016 A1 | 7/2004 | Hoog et al. |
| 2004/0175933 A1 | 9/2004 | Shishida et al. |
| 2004/0266201 A1 | 12/2004 | Wille et al. |
| 2005/0191767 A1 | 9/2005 | Edwards et al. |
| 2005/0266691 A1 | 12/2005 | Gu et al. |
| 2006/0030159 A1 | 2/2006 | Su et al. |
| 2006/0264033 A1 | 11/2006 | Olmen et al. |
| 2007/0057324 A1 | 3/2007 | Tews |
| 2008/0164528 A1 | 7/2008 | Cohen |
| 2009/0017563 A1 | 1/2009 | Jiang et al. |
| 2010/0267231 A1 | 10/2010 | Van Schravendijk et al. |
| 2011/0079918 A1 | 4/2011 | Zhou et al. |
| 2013/0023122 A1 | 1/2013 | Nemani et al. |
| 2013/0023124 A1 | 1/2013 | Nemani et al. |
| 2014/0017898 A1 | 1/2014 | Nemani et al. |
| 2014/0024220 A1 | 1/2014 | Chang et al. |
| 2014/0120726 A1 | 5/2014 | Nemani et al. |
| 2014/0213060 A1 | 7/2014 | Kao et al. |
| 2019/0164829 A1 | 5/2019 | Yang et al. |
| 2019/0304836 A1 | 10/2019 | Kikuchi et al. |
| 2019/0363008 A1 | 11/2019 | Gstrein et al. |

* cited by examiner

FULLY ALIGNED INTERCONNECTS WITH SELECTIVE AREA DEPOSITION

BACKGROUND

The present invention generally relates to semiconductor integrated circuits (ICs) and a method of fabricating the same, and more specifically to structures and methods for forming fully aligned interconnect structures using selective area deposition and removal.

The fabrication of Very-Large Scale Integrated (VLSI) or Ultra-Large Scale Integrated circuits (ULSI) requires an interconnect structure including metallic wiring that connects individual devices in a semiconductor chip, to one another. Typically, the wiring interconnect network consists of two types of features that serve as electrical conductors: line features that traverse a distance across the chip, and via features which connect lines in different levels. Typically, the conducting metal lines and vias include aluminum or copper and are insulated by the interlayer dielectrics (ILD) which are electrical insulators. In order to improve performance, the semiconductor industry has shrunk the gate length and, as a result, the chip size. As a consequence the interconnect structure that forms the metallic circuitry has also shrunk.

Traditionally, the via levels are one of the most challenging to print with a high process latitude. In order to improve the manufacturability of the lithography step, advanced masks that incorporate phase-shifting and optical proximity correction have been employed. In addition, as the size scale of these interconnects decrease, there is growing concern that overlay error between features in the interconnect structure can lead to reliability issues. Overlay errors result from misalignment during the lithography process as the mask invariably may or may not be perfectly aligned to the underlying structure. Although overlay errors can be minimized by reworking the lithography, some level of overlay error is unavoidable.

SUMMARY

Embodiments of the present invention are generally directed to integrated circuits including interconnect structures and methods for fabricating the same. A non-limiting example of a method for forming a metallization level includes forming a dielectric layer over a substrate. The dielectric layer includes a dielectric layer top surface. A metal line is formed in the dielectric layer. The metal line includes a sacrificial upper region and a lower region. The sacrificial upper region is formed separately from the lower region and the lower region includes a lower region top surface positioned below the dielectric layer top surface. The sacrificial upper region is removed, thereby exposing the lower region top surface and forming a trench defined by the lower region top surface and sidewalls of the dielectric layer. An interconnect structure is deposited such that at least a portion of the interconnect structure fills the trench, thereby defining a fully aligned top via.

A non-limiting example of a method of forming an interconnect structure having a fully aligned top via according to aspects of the invention includes forming a plurality of metal lines in a bilayer dielectric. The bilayer dielectric includes a first dielectric layer and a sacrificial dielectric layer on the first dielectric layer. A recess is formed on each of the metal lines by selectively depositing a metal cap on top surfaces of the metal lines, selectively removing the sacrificial dielectric layer, depositing a flowable second dielectric layer in spaces between adjacent metal caps, and selectively removing the metal caps to expose the top surfaces of the metal lines to form the recesses. An etch stop layer is deposited and a third dielectric layer is formed on the etch stop layer. A self-aligned via is formed in the third dielectric layer. The self-aligned via is coupled to selected ones of the metal lines.

A non-limiting example of an integrated circuit according to aspects of the invention includes a plurality of metal lines in a first dielectric layer provided on a substrate and fully aligned vias coupled to selected ones of the metal lines. A lower portion of each one of the fully aligned vias is in a second dielectric layer provided on the first dielectric layer and an upper portion of each one of the fully aligned vias is in a third dielectric layer. An insulative etch stop layer is intermediate the second and third dielectric layers.

Additional features and advantages are realized through the techniques of the present invention. Other embodiments and aspects of the invention are described in detail herein and are considered a part of the claimed invention. For a better understanding of the invention with advantages and features, refer to the description and to the drawings.

DETAILED DESCRIPTION

Figure 1:
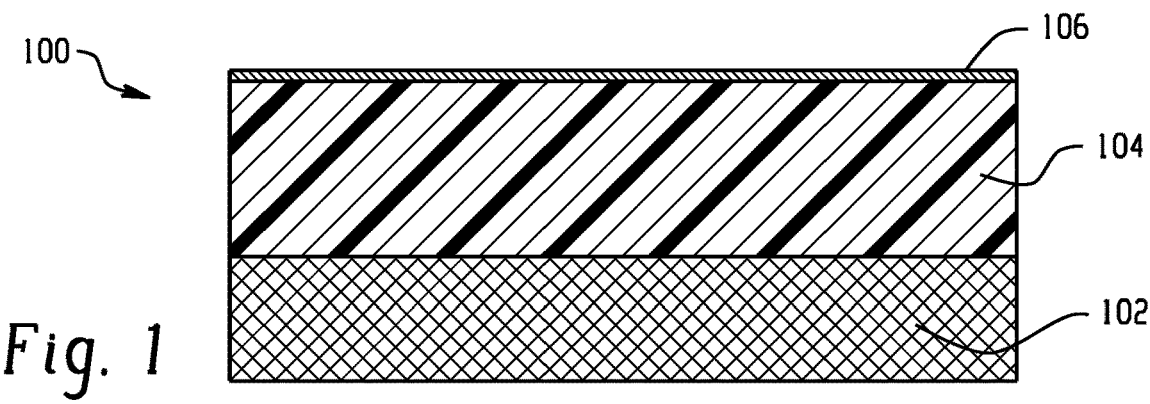
FIG. 1 depicts a cross section of a partial integrated circuit including a sacrificial dielectric on an interlayer dielectric in accordance with one or more embodiments of the present invention.

Fabrication of interconnect structures including fully aligned vias formed of copper can be problematic. Conventionally, providing fully aligned vias requires a copper recess, which is done by a wet process. This copper recess increases line resistance, negatively impacting the performance of the final device. One approach to mitigate the increased line resistance is to start with a thicker copper line, but this complicates the fabrication process and negatively affects yields, Another problem with the use of copper and the conventional damascene processes for fabricating the vias is with misalignment between successive layers. If the via is located too close to the next metal line, over time shorts can develop (driven by the electric field), which is often described using the term "time-dependent dielectric breakdown" (TDDB). In addition, proximity to a neighboring metal line leads to a higher capacitance between the via and the metal line. The misalignment, also referred to as edge placement error, also reduces the contact area between those metals, thereby increasing the contact resistance, A higher capacitance and a higher resistance together give an increased resistance-capacitance delay (RC-delay), i.e. the time required for transistor/device switching. Furthermore, a reduced contact area lowers the electromigration (EM) reliability, which can also lead to eventual failure of the device. These consequences of misalignment in interconnect fabrication are currently limiting the downscaling of semiconductor devices Embodiments of the present invention overcome the above noted problems associated with the prior art and provides a robust process for forming fully aligned vias of copper without having to increase the thickness of the copper or provide added complexity to the fabrication process. As will be discussed in greater detail below the interconnect structures including fully aligned vias formed of copper and processes for fabricating the same according to various aspects of the present invention include deposition of a sacrificial dielectric material onto the bulk dielectric layer followed by copper line formation therein. Line formation generally includes selective area deposition to form a sacrificial metallic capping layer on the copper line, wherein metallic residues from the selective area deposition of the sacrificial metallic capping layer can be present on the sacrificial dielectric material as a function of the selective area deposition process. These metallic residues are subsequently removed by removal of the sacrificial dielectric material, which eliminates concerns with shorting or TDDB. Moreover, fabrication of fully aligned vias formed of copper does not require the use of tall copper lines, i.e., a metal layer thickness equal to the via and line height. The sacrificial dielectric layer on the bulk dielectric removes the metallic residues without attacking the sacrificial metal capping layer on the copper lines.

Detailed embodiments of the integrated circuit include an interconnect structure and methods for fabricating the integrated circuit. It is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET), and/or other semiconductor devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOS s, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the term "about" modifying the quantity of an ingredient, component, or reactant of embodiments of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments of the invention, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

Turning now to FIG. 1, there is shown an integrated circuit 100 during an intermediate step of a method for fabricating back end of line interconnect structures on a substrate 102 including fully aligned vias according to exemplary embodiments of the invention. More specifically, the method includes deposition of a bulk dielectric layer 104 on the substrate 102. In some embodiments of the invention, a relatively thin sacrificial dielectric layer 106 is deposited on the bulk dielectric layer 104 to form a bilayer dielectric. As will be discussed in greater detail below, the sacrificial dielectric layer 106 will be removed in later processing steps and is selected to be selectively removed relative to the bulk dielectric layer 104.

The substrate 102 can be a lower metallization level including one or more interconnect structures, middle of the line contacts or vias, or front of the line devices.

The bulk dielectric layer 104 can be composed of any low k dielectric material having a dielectric constant less than about 3.9, which can include inorganic dielectrics or organic dielectrics. The dielectric material can be porous or non-porous. In one or more embodiments of the invention, the dielectric material is selected to have a dielectric constant less than 3.0. Some examples of suitable dielectric materials that can be used include, but are not limited to silicon dioxide, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The bulk dielectric layer 104 can be deposited by a deposition process such as, for example, chemical vapor deposition (CVD), plasma enhanced chemical vapor deposition (PECVD) or spin-coating as is generally known in the art.

Suitable materials for forming the sacrificial dielectric layer 106 include, but are not intended to be limited to, aluminum oxide, silicon dioxide, silicon nitride, and the like. In one or more embodiments of the invention, the sacrificial dielectric layer 106 can have a thickness from 1 nanometer (nm) to 10 nm, although greater or lesser thicknesses are contemplated and can be employed in the present application. The sacrificial dielectric layer 106 can be deposited by a deposition process such as, for example, chemical vapor deposition (CVD), plasma enhanced chemical vapor deposition (PECVD) or spin-coating as is generally known in the art.

Figure 2:
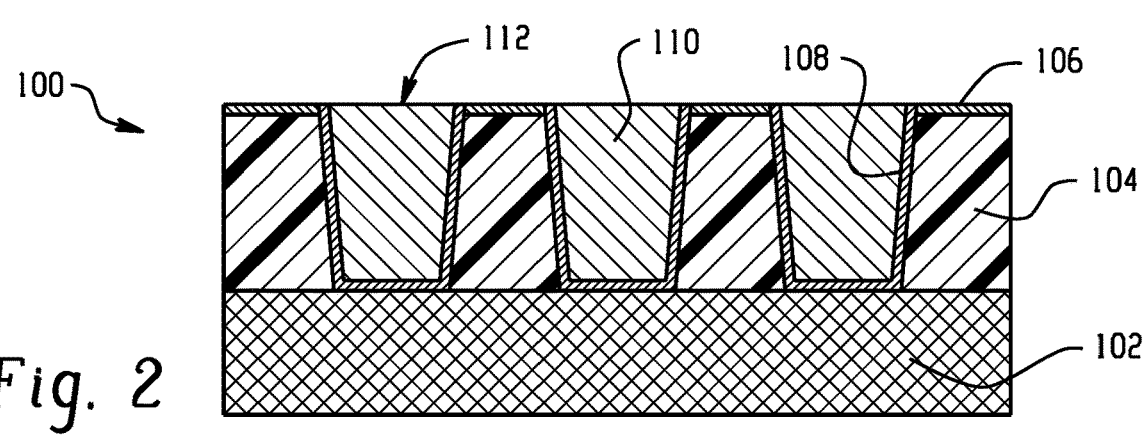
FIG. 2 depicts a cross section of the integrated circuit of FIG. 1 subsequent to damascene patterning to form a plurality of metal lines in the interlayer dielectric for a lower metallization level in accordance with one or more embodiments of the present invention.

FIG. 2 depicts a cross section of the integrated circuit 100 of FIG. 1 subsequent to formation of metal lines 110 in a lower metallization level, e.g., Mx−1. The lower metallization level can be conventionally formed using lithographic patterning of a photoresist (not shown) layer disposed on a hardmask layer (not shown). The photoresist pattern is then transferred into the hardmask layer using a wet etch or dry etch process. The pattern formed in the hardmask is then transferred into the dielectric layer 104 to form trench features. The trench features are then lined with a conformal liner layer 108 and filled with a metal 110 such as copper, ruthenium, cobalt, iridium, rhodium, aluminum, alloys thereof, or the like forming an overburden thereon. Depending on the metal being deposited, a seed layer (not shown) can first be deposited to promote adhesion to the liner layer 108. The integrated circuit 100 is then subjected to a planarization process such as by chemical mechanical planarization (CMP) to remove any overburden of the deposited metal. The sacrificial dielectric layer 106, in embodiments where present, can act as a stop layer in the CMP process. In this manner, a plurality of metal lines 110 at a desired pitch are formed in the bulk dielectric layer 104, which is also referred to as an interlayer dielectric. Subsequent to the planarization process, top surfaces 112 of the metal lines 110 are coplanar to the sacrificial dielectric layer 106.

The liner layer 108 can be formed of tantalum (Ta), tantalum nitride (TaN), titanium (Ti), titanium nitride (TiN), ruthenium (Ru), ruthenium nitride (RuN), ruthenium tantalum (RuTa), ruthenium tantalum nitride (RuTaN), tungsten nitride (WN) or any other material that can serve as adhesion layer and/or a barrier to prevent diffusion of the conductive hulk metal. The thickness of the liner layer 108 can vary depending on the deposition process used as well as the material employed. In one or more embodiments of the invention, the liner layer 108 can have a thickness from 1 nm to 10 nm; although other thicknesses for the diffusion barrier material are contemplated and can be employed in the present application as long as the liner layer does not entirely fill the opening. The liner layer can be formed by a deposition process including, for example, chemical vapor deposition (CVD), plasma enhanced chemical vapor deposition (PECVD) atomic layer deposition (ALD), physical vapor deposition (PVD), sputtering, chemical solution deposition or plating.

The metal 110 can be deposited by chemical vapor deposition, plasma enhanced deposition, an electroplating process or the like.

Figure 3:
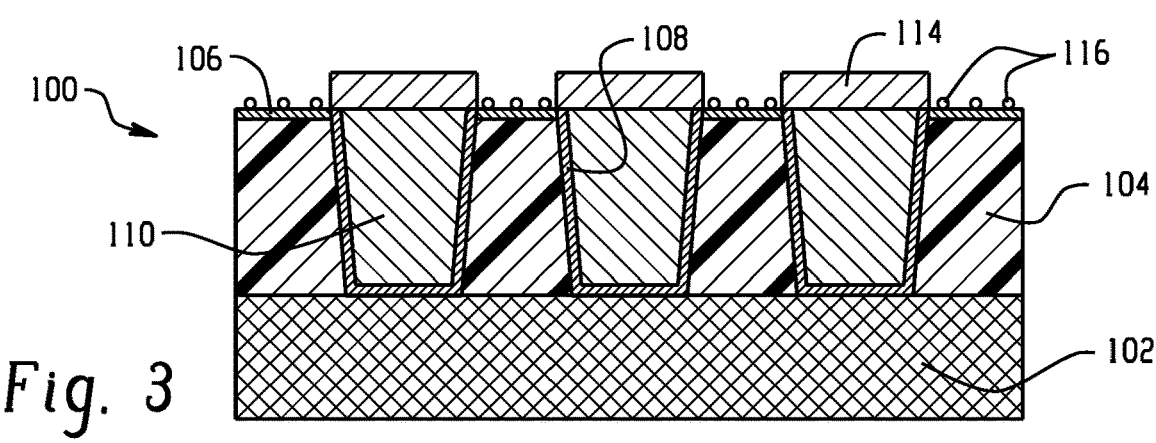
FIG. 3 depicts a cross section of the integrated circuit of FIG. 2 subsequent to selective area deposition of a metal cap layer on top surfaces of the metal lines in accordance with one or more embodiments of the present invention.

FIG. 3 depicts a cross section of the integrated circuit of FIG. 2 subsequent to selective area deposition of a sacrificial metal cap 114 on the exposed top surfaces 112 of the metal lines 110. The selective area deposition of the metal cap 114 in combination with the liner layer 108 encapsulates the metal line 110 preventing it from being exposed during subsequent processing as well as preventing electromigration. Suitable metals for the selective area deposition of the metal cap will generally depend on the underlying metal and is selected to provide etch selectivity relative to the underlying metal 110. Exemplary metals include, but are not limited to, cobalt, ruthenium, multilayers thereof such as a cobalt-ruthenium bilayer, alloys thereof, and the like. In one or more embodiments of the invention, the thickness of the metal cap 114 is about 5 nanometers (nm) to about 20 nm, and in one or more other embodiments of the invention, the thickness of the metal 114 is about 10 nm to about 15 nm. The metal cap 114 can be deposited by chemical vapor deposition, atomic layer deposition or the like. It has been found that as the thickness of metal cap 114 increases, deposition selectivity decreases, which results in the deposition of metallic residues 116 on the bulk dielectric surface 104 (or, when present, the sacrificial dielectric layer 106).

Figure 4:
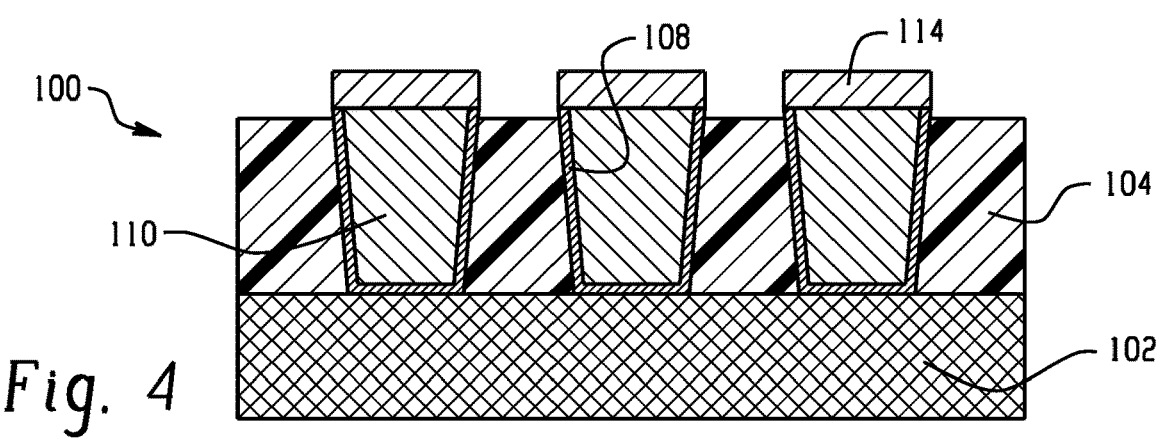
FIG. 4 depicts a cross section of the integrated circuit of FIG. 3 subsequent to removal of the sacrificial dielectric layer in accordance with one or more embodiments of the present invention.

FIG. 4 depicts a cross section of the integrated circuit of FIG. 3 subsequent to removal of the metallic residues 116. In some embodiments of the invention, selective removal of the sacrificial dielectric layer 106 from the bulk dielectric surface 104 ensures the complete removal of the metallic residues 116. In short, the metallic residues 116 previously deposited onto the sacrificial dielectric layer 106 will advantageously be lifted off along with the removal of the sacrificial dielectric layer 106 from the bulk dielectric surface 104. Selective removal can be a dry etch process or a wet etch process although a wet etch is generally preferred so as to prevent plasma damage to the underlying dielectric surface 104, which is not always visibly apparent. For example, a sacrificial dielectric layer 106 formed of aluminum oxide can be removed using a hydrofluoric acid etch etchant composition as is generally known in the art.

In embodiments where the sacrificial dielectric layer 106 is not present, the metallic residues 116 are formed on the bulk dielectric surface 104. In those embodiments, the bulk dielectric surface 104 can be recessed to remove the metallic residues 116. In some embodiments of the invention, recessing the bulk dielectric surface 104 results in damage to the topmost portion of the bulk dielectric surface 104 (i.e., at the interface with the recess etchant). In some embodiments of the invention, the damaged portion of the bulk dielectric surface 104 is selectively removed, using, for example, a wet etch. In this manner, remaining portions of the bulk dielectric surface 104 will be damage-free.

Figure 5:
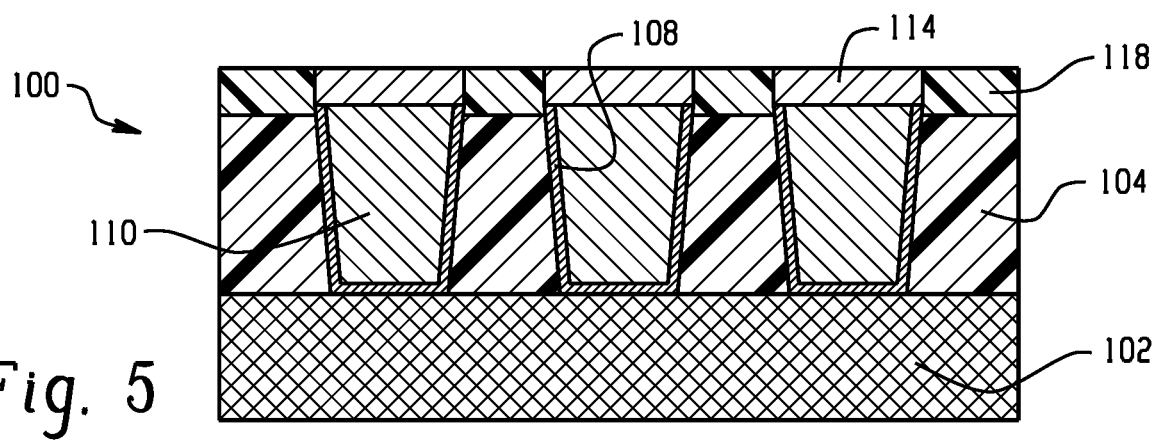
FIG. 5 depicts a cross section of the integrated circuit of FIG. 4 subsequent to deposition and planarization of a dielectric material in accordance with one or more embodiments of the present invention.

FIG. 5 depicts a cross section of the integrated circuit of FIG. 4 subsequent to deposition of a dielectric material 118 onto the integrated circuit 100 followed by planarization such that the dielectric material 118 and the metal cap 114 that had been deposited by selective area deposition have coplanar top surfaces. The dielectric material 118 can be the same or a different as dielectric layer 106. In one or more embodiments of the invention, depending on the pitch of the metal lines, i.e., spacing between adjacent metal lines, a flowable oxide or low k dielectric material can be deposited onto the dielectric layer 106.

Figure 6:
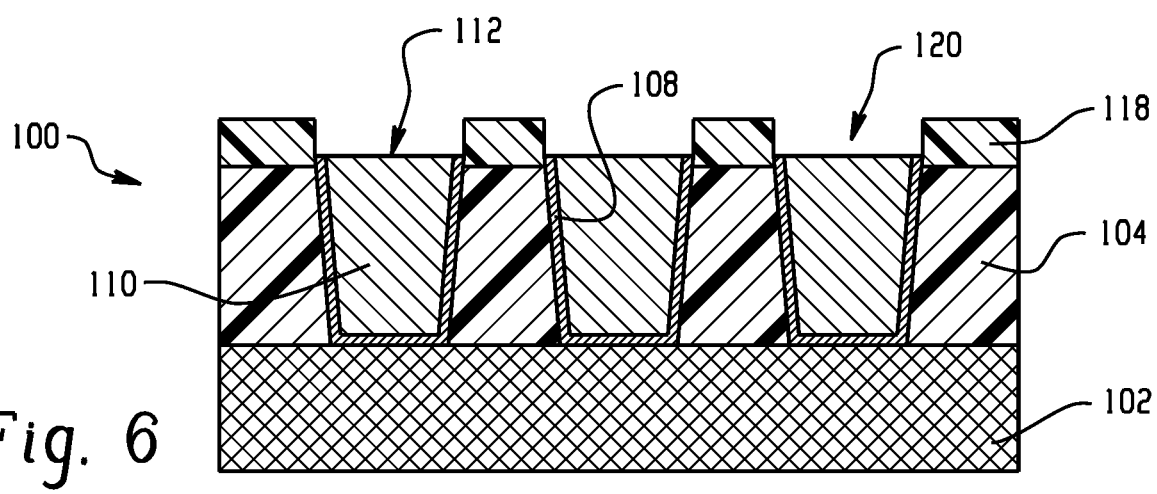
FIG. 6 depicts a cross section of the integrated circuit of FIG. 5 subsequent to selective removal of the metal cap to form recesses above the metal lines in accordance with one or more embodiments of the present invention.

FIG. 6 depicts a cross section of the integrated circuit of FIG. 5 subsequent to selective removal of the selective area deposition of the metal cap 114. Removal of the selective area deposition of the metal cap 114 forms recesses 120 exposing the top surfaces 112 of the metal lines 110. Selective removal can be a dry etch process or a wet etch process although wet etch is generally preferred so as to prevent plasma damage to the dielectric layer 104 and dielectric material 118.

Figure 7:
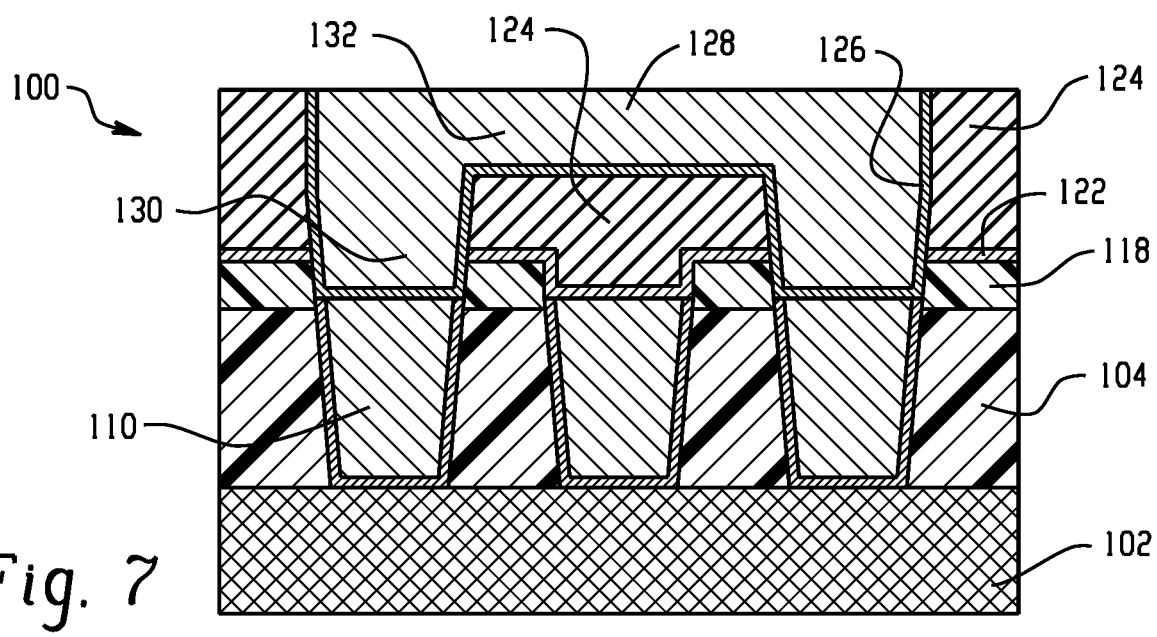
FIG. 7 depicts a cross section of the integrated circuit of FIG. 6 subsequent to a dual damascene process to form fully aligned top vias on the metal lines in the lower metallization level and metal lines for an upper metallization level in accordance with one or more embodiments of the present invention.

FIG. 7 depicts a cross section of the integrated circuit of FIG. 6 subsequent to formation of a fully aligned interconnect structure, which in the illustrated embodiment of the invention is a fully aligned via 130. The fully aligned vias 130 (e.g., Vx−1) in the recesses 120 for the lower metallization level (e.g., (Mx−1) and the lines 132 for an upper metallization level (Mx) using a dual damascene process. Formation includes conformal deposition of an etch stop layer 122 followed by deposition of a dielectric layer 124 thereon. The etch stop layer 122 can be an insulating material such as, for example, aluminum oxide, silicon nitride, silicon carbonitride, silicon carbide or silicon borocarbonitride, or silicon carboxynitride, and the like. The dielectric layer 124 is then subjected to the dual damascene process, which generally includes standard lithography and etching techniques to form via openings and trench features followed by opening the etch stop layer at the bottom of the via openings, which exposes the top surface 112 of one or more of the underlying metal lines 110. As shown in FIG. 7, the dielectric layer 124 can be patterned such that one or more of the underlying metal lines 110 remains covered by dielectric materials (e.g., the middle line of the metal lines 110, although any of the lines can remain covered as needed).

Patterning the dielectric layer 124 is followed by deposition of a liner layer 126. After deposition of the liner layer 126, an optional seed layer is deposited by physical vapor deposition (PVD) followed by the deposition of a metal 128, e.g., electroplating of copper, which fills the via and trench. The top surface is then planarized to remove any overburden and liner layer from the upper most surface so as to form a planar surface. A capping layer can then be deposited on the planar surface. The resulting top vias 130 are fully aligned to the metal lines 110 in the lower metallization level e.g., Mx−1, and the metal lines 132 above the top via 130 define a portion of an upper metallization level, e.g., Mx.

The descriptions of the various embodiments of the present invention have been presented for purposes of illustration but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A method of forming a back end of line metallization level, the method comprising:
   forming a dielectric layer over a substrate, the dielectric layer comprising a dielectric layer top surface;
   depositing a sacrificial dielectric layer on the dielectric layer;
   forming a metal line in the dielectric layer, the metal line comprising a sacrificial upper region and a lower region, the sacrificial upper region formed separately from the lower region, the lower region comprising a lower region top surface positioned below the dielectric layer top surface;
   removing the sacrificial upper region, thereby exposing the lower region top surface and forming a trench defined by the lower region top surface and sidewalls of the dielectric layer; and
   depositing an interconnect structure such that at least a portion of the interconnect structure fills the trench, thereby defining a fully aligned top via;
   wherein the sacrificial upper region of the metal line is selectively formed on the lower region top surface, wherein residues of a metal of the sacrificial upper region are deposited onto the sacrificial dielectric layer, and wherein the metal of the sacrificial upper region is different from a metal of the lower region.

2. The method of claim 1, wherein selectively forming the sacrificial upper region comprises a selective area deposition process.

3. The method of claim 1 further comprising simultaneously removing the sacrificial dielectric layer and lifting off the metal residues.

4. The method of claim 3, wherein simultaneously removing the sacrificial dielectric layer and lifting off the metal residues comprises a wet etch process.

5. The method of claim 1, wherein the sacrificial upper region comprises a thickness of about 5 nanometers (nm) to about 20 nm.

6. The method of claim 1, wherein depositing the interconnect structure comprises:
   conformally depositing an etch stop layer subsequent to forming the trench;
   depositing a third dielectric layer onto the etch stop layer;
   patterning the third dielectric layer to form via openings to the metal line and trench features;
   lining the via openings and trench feature with a liner layer; and
   filling the via openings and the trench feature with a conductive material.

7. The method of claim 1, wherein the substrate comprises an underlying interconnect structure, a middle of the line contact structure, or a front end of the line device.

8. A method of forming an interconnect structure having a fully aligned top via, the method comprising:
   forming a plurality of metal lines in a bilayer dielectric, wherein the bilayer dielectric comprises a first dielectric layer and a sacrificial dielectric layer on the first dielectric layer;
   forming a recess on each of the metal lines, the recess formed by selectively depositing a metal cap on top surfaces of the metal lines, selectively removing the sacrificial dielectric layer, depositing a flowable second dielectric layer in spaces between adjacent metal caps, and selectively removing the metal caps to expose the top surfaces of the metal lines to form the recesses;
   depositing an etch stop layer;
   depositing a third dielectric layer on the etch stop layer; and
   forming self-aligned vias in the third dielectric layer, wherein the self-aligned vias are coupled to selected ones of the metal lines.

9. The method of claim 8, wherein the sacrificial dielectric layer comprises aluminum oxide, silicon dioxide, or silicon nitride.

10. The method of claim 8, wherein the metal cap is at a thickness of about 5 nanometers (nm) to about 20 nm.

11. The method of claim 8, wherein selectively depositing the metal cap comprises a selective area deposition process.

12. The method of claim 8, further comprises forming a plurality of metal lines in the third dielectric layer above the self-aligned top via for an overlying metallization level.

13. A method of forming a back end of line metallization level, the method comprising:
   forming a dielectric layer over a substrate, the dielectric layer comprising a dielectric layer top surface;
   forming a metal line in the dielectric layer, the metal line comprising a sacrificial upper region and a lower region, the sacrificial upper region formed separately from the lower region, the lower region comprising a lower region top surface positioned below the dielectric layer top surface;
   removing the sacrificial upper region, thereby exposing the lower region top surface and forming a trench defined by the lower region top surface and sidewalls of the dielectric layer; and
   depositing an interconnect structure such that at least a portion of the interconnect structure fills the trench, thereby defining a fully aligned top via, wherein depositing the interconnect structure comprises:
   conformally depositing an etch stop layer subsequent to forming the trench;

depositing a third dielectric layer onto the etch stop layer;

patterning the third dielectric layer to form via openings to the metal line and trench features;

lining the via openings and trench feature with a liner layer; and filling the via openings and the trench feature with a conductive material.

\* \* \* \* \*